United States Patent
Pelley et al.

(10) Patent No.: US 9,933,954 B2
(45) Date of Patent: Apr. 3, 2018

(54) PARTITIONED MEMORY HAVING PIPELINE WRITES

(71) Applicant: FREESCALE SEMICONDUCTOR, INC., Austin, TX (US)

(72) Inventors: Perry H. Pelley, Austin, TX (US); Anirban Roy, Austin, TX (US)

(73) Assignee: NXP USA, Inc., Austin, TX (US)

( * ) Notice: Subject to any disclaimer, the term of this patent is extended or adjusted under 35 U.S.C. 154(b) by 39 days.

(21) Appl. No.: 14/886,215

(22) Filed: Oct. 19, 2015

(65) Prior Publication Data

US 2017/0109079 A1 Apr. 20, 2017

(51) Int. Cl.
- *G06F 12/00* (2006.01)
- *G06F 3/06* (2006.01)
- *G06F 12/127* (2016.01)
- *G06F 12/06* (2006.01)

(52) U.S. Cl.
CPC .......... *G06F 3/0613* (2013.01); *G06F 3/0644* (2013.01); *G06F 3/0679* (2013.01); *G06F 3/0619* (2013.01); *G06F 3/0659* (2013.01); *G06F 12/0646* (2013.01); *G06F 12/127* (2013.01)

(58) Field of Classification Search
CPC .... G06F 3/0613; G06F 3/0644; G06F 3/0679; G06F 13/3625; G06F 13/372; G06F 13/4273; G06F 13/4291
USPC ...... 711/102, 149, 152, 173; 710/17, 25, 58, 710/143; 712/13, 225
See application file for complete search history.

(56) References Cited

U.S. PATENT DOCUMENTS

| | | | |
|---|---|---|---|
| 5,420,997 A | 5/1995 | Browning et al. | |
| 5,896,335 A | 4/1999 | Myers et al. | |
| 6,052,302 A | 4/2000 | Moyer et al. | |
| 6,938,132 B1 * | 8/2005 | Joffe | G06F 9/3824 710/100 |
| 7,379,068 B2 | 5/2008 | Radke | |
| 7,542,356 B2 * | 6/2009 | Lee | G11C 7/06 365/185.14 |
| 8,140,742 B2 * | 3/2012 | Norman | G06F 12/0246 365/63 |
| 8,570,799 B2 * | 10/2013 | Hildebrand | G06F 12/00 365/104 |

(Continued)

OTHER PUBLICATIONS

Joo et al, "Energy- and Endurance-Aware Design of Phase Change Memory Caches", DATE Conference, 2010, pp. 1-6.

(Continued)

*Primary Examiner* — Reba I Elmore (57) ABSTRACT

A memory device includes a non-volatile memory (NVM) array and a memory controller. The NVM array has four partitions in which each partition has as plurality of groups of NVM cells. The memory controller that performs a written operation on each of the four partitions in four cycles per group of NVM cells beginning a clock cycle apart in which two of the four clock cycles for the write operation are for an array write that requires a relatively high current and that the array write for each partition overlaps no more than one other array write so that a peak current of all four write operations is no more than twice the peak current of one group. The NVM cells may be magnetic tunnel junctions (MTJs) which have significantly faster written times than typical NVM cells.

19 Claims, 3 Drawing Sheets

(56) References Cited

U.S. PATENT DOCUMENTS

| | | | | |
|---|---|---|---|---|
| 9,063,838 B1* | 6/2015 | Boyle | | G06F 12/02 |
| 2003/0133348 A1* | 7/2003 | Wong | | G11C 11/56 |
| | | | | 365/222 |
| 2009/0086530 A1* | 4/2009 | Chung | | G11C 11/16 |
| | | | | 365/158 |
| 2011/0055458 A1* | 3/2011 | Kuehne | | G06F 12/0246 |
| | | | | 711/103 |
| 2012/0089854 A1* | 4/2012 | Breakstone | | G06F 1/30 |
| | | | | 713/323 |
| 2012/0096215 A1* | 4/2012 | Zhang | | G06F 12/0246 |
| | | | | 711/103 |
| 2012/0210021 A1* | 8/2012 | Flynn | | G06F 3/061 |
| | | | | 710/5 |
| 2013/0256818 A1* | 10/2013 | Nikonov | | B82Y 25/00 |
| | | | | 257/421 |
| 2014/0075233 A1* | 3/2014 | Bartling | | G06F 11/1469 |
| | | | | 713/324 |
| 2014/0122329 A1* | 5/2014 | Naggar | | G06Q 20/3552 |
| | | | | 705/41 |
| 2014/0156921 A1* | 6/2014 | Schuette | | G06F 3/0616 |
| | | | | 711/103 |
| 2014/0359204 A1* | 12/2014 | Yoo | | G06F 12/0246 |
| | | | | 711/103 |
| 2015/0092478 A1* | 4/2015 | Fifield | | G11C 11/1693 |
| | | | | 365/158 |
| 2015/0194201 A1* | 7/2015 | Kim | | H03M 13/05 |
| | | | | 714/763 |

OTHER PUBLICATIONS

Guo et al, "Resistive Computation: Avoiding the Power Wall with Low-Leakage, STT-MRAM Based Computing", ISCA '10, Jun. 19-23, 2010, pp. 371-382.

Bishnoi et al, "Avoiding Unnecessary Write Operations in STT-MRAM for Low Power Implementation", International Symposium on Quality Electronic Design (ISQED), Mar. 3-5, 2014, pp. 548-553.

* cited by examiner

PARTITIONED MEMORY HAVING PIPELINE WRITES

BACKGROUND

Field

This disclosure relates generally to memories, and more specifically, to a partitioned memory having pipelined writes.

Related Art

In many non-volatile memories, such as in a magnetoresistive random access memory (MRAM), a write operation takes much longer and requires far more current than a read operation. For example, a write operation in an MRAM may be twice as long as and require five times the current of a read operation. While the read operations in these non-volatile memories are approaching read access times of static random access memories (SRAMs), the write operations remain a significant limitation to use of these non-volatile memories. Therefore, a need exists for improved write operations in a non-volatile memory.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

An NVM has a maximum allowable peak current, and typically, the largest currents are generated during write operations. In one embodiment, write data and mask inversion is used to ensure that the peak current during a write operation only reaches, at most, half the maximum allowable peak current. Furthermore, the NVM array can be partitioned such that write operations can be staggered in a pipelined fashion among the partitions. In this manner, write operations to different partitions are performed simultaneously. This allows for completion of write operations in consecutive clock cycles, similar to read operations. Furthermore, by limiting the number of array writes during the write operations which can occur simultaneously, the peak current can be maintained within acceptable limits.

Figure 1:
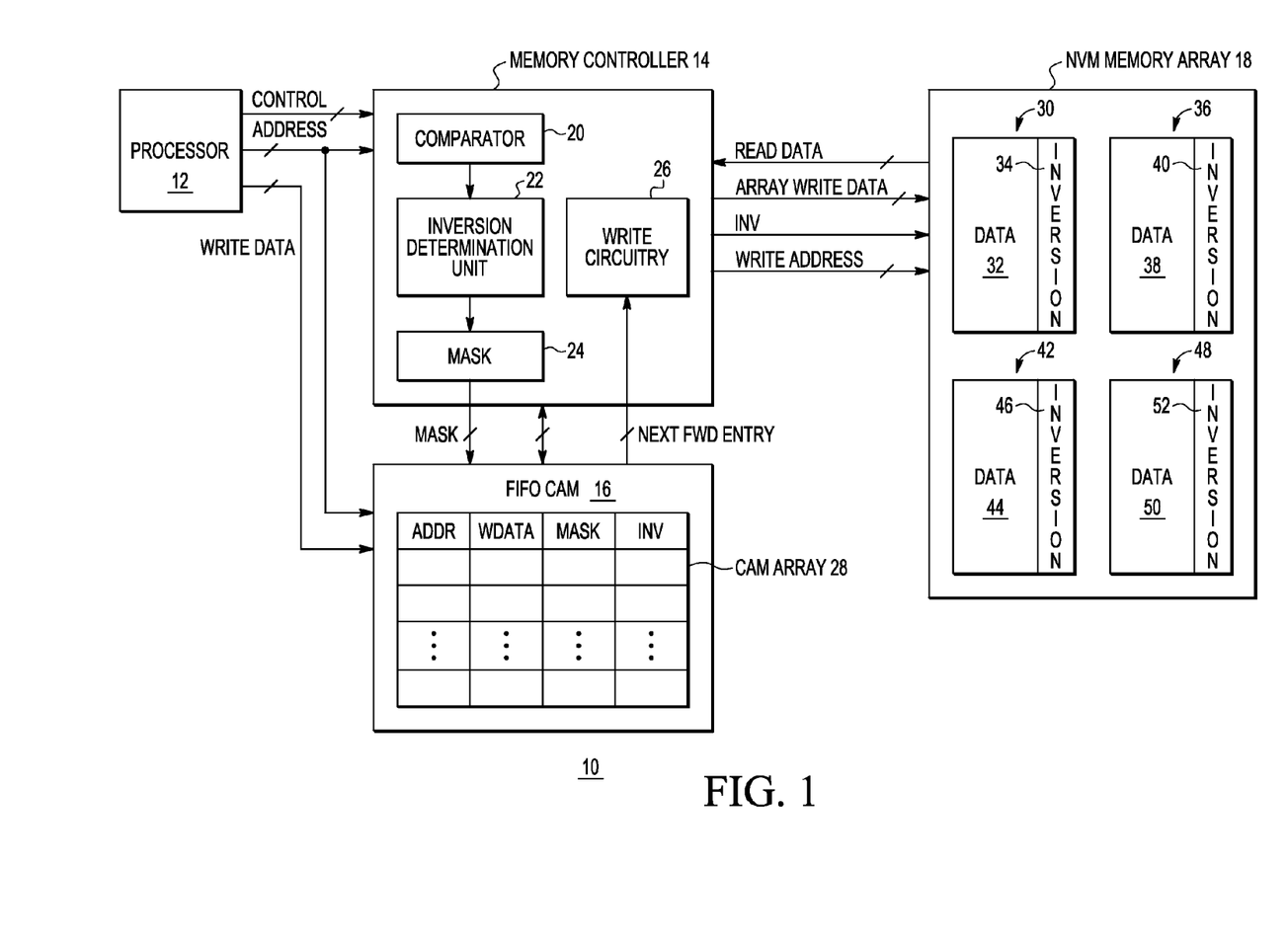
FIG. 1 illustrates, in block diagram form, a system 10 in accordance with one embodiment of the present invention.

FIG. 1 illustrates, in block diagram form, a system 10 in accordance with one embodiment of the present invention. System 10 includes a processor 12, memory controller 14, a first-in first-out (FIFO) content addressable memory (CAM) 16, and an NVM memory array 18. Memory controller 14 includes a comparator 20, an inversion determination unit 22, mask storage circuitry 24, and write circuitry 26. FIFO CAM 16 includes a CAM array 28 which includes a plurality of entries, each entry including an address, write data, a mask, and an inversion indicator. NVM memory array 18 includes a partitioned memory array. Illustrated in FIG. 1 are 4 memory partitions: partition 30, partition 36, partition 42, and partition 48. Each partition includes a data portion and an inversion portion. The data portion of each partition stores data and the inversion portion of the partition stores an inversion indicator for each row of the data portion. Therefore, partition 30 includes data portion 32 and inversion portion 34, partition 36 includes data portion 38 and inversion portion 40, partition 42 includes data portion 44 and inversion portion 46, and partition 48 includes data portion 50 and inversion portion 52. For example, referring to partition 30, each row in data portion 32 has a corresponding inversion indicator in inversion portion 34. In one embodiment, NVM array 18 is an MRAM array. In one embodiment, the MRAM array includes magnetic tunnel junctions (MTJs).

Processor 12 performs write operations on NVM memory array 18. It does so by providing control information and address information to memory controller 14, and providing the address information and write data to CAM array 28. As write operations get generated by processor 12, they get stored into a newest entry of CAM array 28. FIFO CAM 16, which includes CAM array 28, provides its oldest entry to memory controller 14 for writing to NVM memory array 18. In this manner, write operations are performed in the order they are received. Each write operation to NVM memory array 28 is performed as a read-modify-write. Therefore, each write operation includes an array read (where read data is read from array 18) and an array write (where write data is written to array 18. For each write operation received from processor 12, the write data and the write address are stored in CAM array 28. Memory controller 14, which also receives the address, obtains read data from a location of array 18 addressed by the received write address. This read data is compared to the write data by comparator 20 to determine which bits are actually different and need to thus be inverted. This information is used to generate a mask which indicates which bits at the address location need to be inverted. For example, comparator 20 may perform a bit-wise XOR between the read data and the write data to generate the mask. In this example, only those bits that mismatch will result in an asserted bit of the resulting mask. Therefore, only those bits of the addressed location which correspond to the asserted bits of the mask need to be inverted to result in the write data. This mask can be stored in storage location 24 and is provided to CAM array 28 to be stored in the mask field of the entry corresponding to the write address.

Memory controller 14 also includes an inversion determination unit 22 which is used to determine whether the write data should be inverted to result in a fewer number of bits which need to be inverted at the addressed location. If the write data is inverted, the corresponding inversion bit in the entry corresponding to the write address in CAM array 28 is asserted. This inversion bit, upon an array write of the write data to NVM array 18, will be written as well to reflect that the write data is actually the inverse of the desired data when the data is read back from the location for a read operation. Write circuitry 26 performs an array write for each entry of CAM array 28 in turn. That is, the next FIFO entry is provided from CAM array 28 to write circuitry 26. Write circuitry 26 applies the mask to the addressed location in a data portion of NVM array 18 to only flip (i.e. invert) those bits that are needed to result in the write data being stored at the write address. The inversion bit of the next FIFO entry is also stored in the inversion portion of the addressed location.

Figure 3:
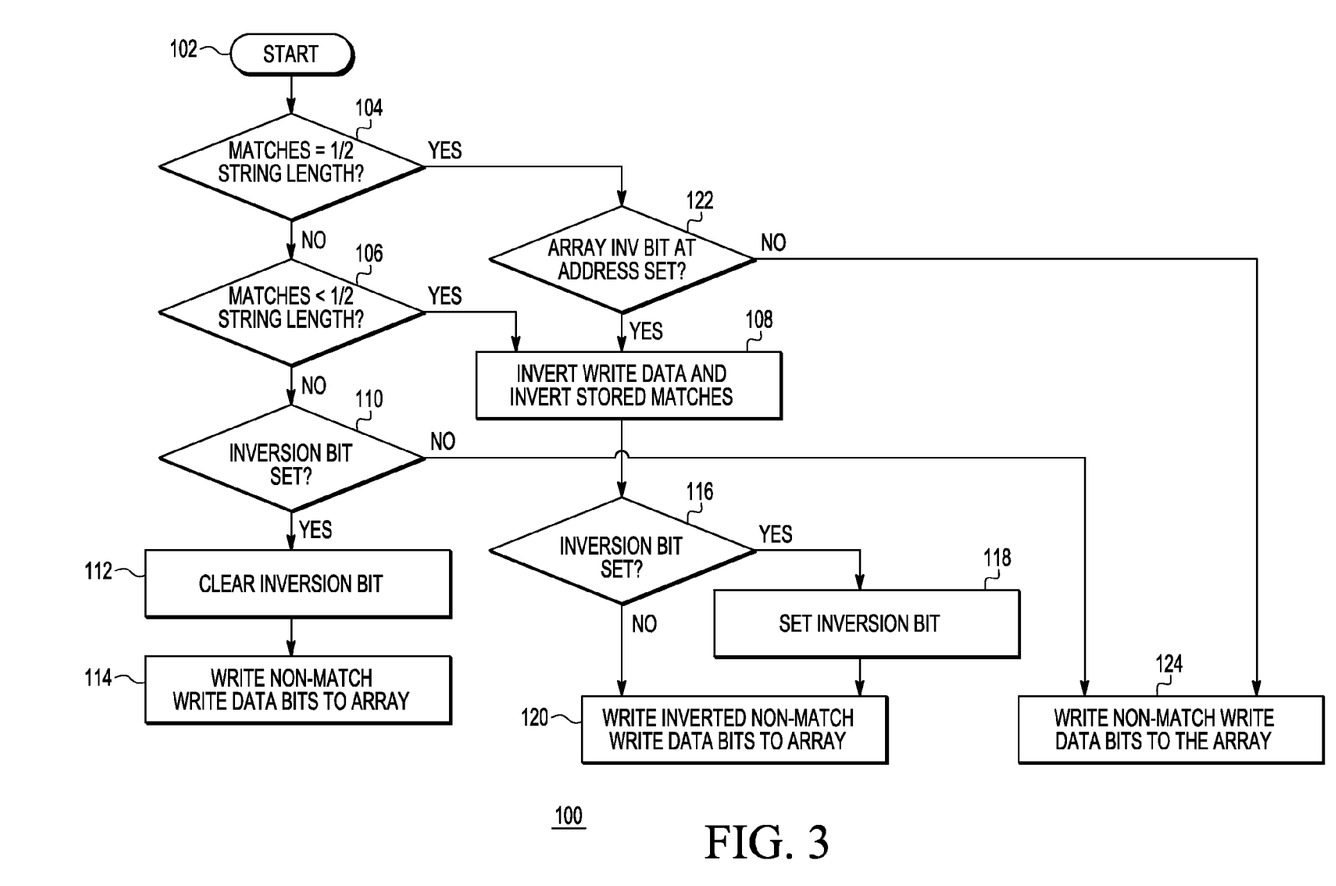
FIG. 3 illustrates, in flow diagram form, a method for performing a write operation, in accordance with one embodiment of the present invention.

By reducing the number of bits to be inverted upon a write to NVM array 18, current is reduced. Therefore, in one embodiment, inversion determination unit 22 is used to reduce the number of bits to be inverted. FIG. 3 illustrates, in accordance with one embodiment, a method 100 used to determine whether to invert the write data or not. Method 100 begins with start 102 and proceeds to decision diamond 104. At decision diamond 104, upon comparing the read data stored at the write address with the write data (such as by comparator 20), it is determined whether the number of bits that match is equal to half the number of bits of the write data. If not, method 100 proceeds to decision diamond 106 in which it is determined whether the number of bits which match is less than half the length of the write data (i.e. less than the total number of bits of the write data). If so, then the write data and the mask in the entry of CAM array 28 corresponding to the write address are inverted. Also, the inversion bit, if not already asserted (decision diamond 116) in CAM array 28, is asserted in block 118. If, at decision diamond 106, it is determined that the number of bits that match is not less than half the length of the write data (indicating that it is greater than half the total number of bits of the write data), the inversion bit, if not already cleared (decision diamond 110) in CAM array 28, is cleared in block 112.

Referring back to decision diamond 104, if the number of bits that match between the read data and the write data is exactly half the length of the write data (i.e. half the total number of bits of the write data), then the inversion bit is used to determine whether an inversion of the mask and data is to occur. If the inversion bit received from the inversion portion with the read data of the addressed location is asserted, then method 100 proceeds to block 108 in which the write data and mask are inverted. If the inversion bit is not asserted, then no inversion of the write data or mask is performed. In an alternate embodiment, an inversion may be performed if the number of matched bits is less than or equal to half the number of bits of the write data rather than using the inversion bit received with the read data.

When an entry in CAM array 28 is provided as the next FIFO entry to write circuitry 26, the mask and inversion bit are used to perform an array write in NVM array 28. The mask is used such that only those bits at the write address which differ from the write data (corresponding to an asserted bit in the mask) are inverted. For example, in blocks 114 or 124, when no inversion of the write data or mask occurred for the CAM entry, the asserted mask bits correspond to the non-match write data bits which are written to the addressed location of array 18 by inverting the corresponding bit value. In block 120, when there has been an inversion of the write data and the mask, the asserted mask bits correspond to the non-match inverted data bits which are written to the addressed location of array 18 by inverting the corresponding bit value. In this manner, at most only half of bits stored at the write address will need to be inverted to result in writing the write data to array 18. This ensures that at most half of the maximum allowable peak current will be generated during an array write for the write operation.

During a read operation of NVM array 18 provided by processor 12, the inversion bit from the inversion portion corresponding to the read data indicates whether the desired read data is in its inverted form or not. Also, for a read operation by processor 12, a lookup in CAM array 28 can be performed. If the address location for the read operation is in the CAM, then the write data (along with the corresponding inversion bit) can be provided back to processor 12 as the read data, rather than waiting for the write to array 18 to occur and reading the location from array 18. This allows for a more efficient read operation.

Furthermore, there are multiple partitions in array 18 which allows for improved efficiency of write operations. By performing write operations on different partitions, they can be pipelined to allow the output of write operations to be provided each clock cycle. For each write operation, the array write portion generates the peak current. Since the use of inversion determination unit 22 ensures that at most half the maximum allowable peak current is generated during an array write of a write operation, two array writes can be performed simultaneously on two different partitions of NVM array 18.

Figure 2:
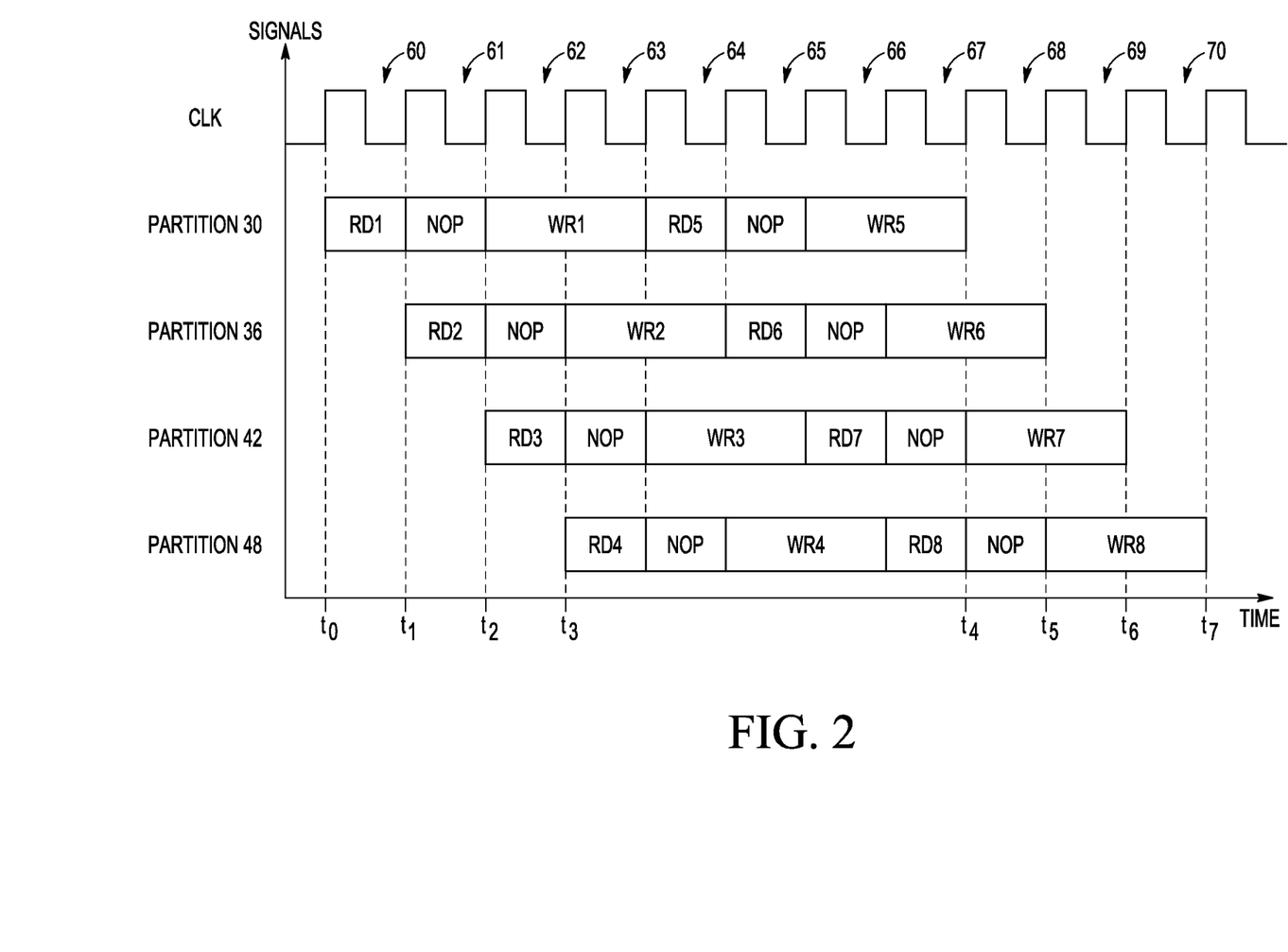
FIG. 2 illustrates a timing diagram of pipelined write operations within system 10, in accordance with one embodiment of the present invention.

FIG. 2 illustrates a timing diagram of a 8 write operations (i.e. program operations) performed in a pipelined manner in system 10 during clock cycles 60-70. A first write operation includes a read, RD1, and an array write, WR1. A second write operation includes a read, RD2, and an array write, WR2. A third write operation includes a read, RD3, and an array write, WR3. A fourth write operation includes a read, RD4, and an array write, WR4. A fifth write operation includes a read, RD5, and an array write, WR5. A sixth write operation includes a read, RD6, and an array write, WR6. A seventh write operation includes a read, RD7, and an array write, WR7. An eighth write operation includes a read, RD8, and an array write, WR8. Each read operation takes only one clock cycle, but each write operation takes two clock cycles. Each row of the timing diagram corresponds to operations performed on a particular partition of array 18. Therefore, the first and fifth write operations are performed on partition 30, the second and sixth on partition 36, the third and seventh on partition 42, and the fourth and eighth on partition 48.

In the example of FIG. 2, NVM controller 14 directs the first write operation to write or program a group (i.e. a row) of NVM cells at a particular address location (i.e. write address) in partition 30. The first write operation is commenced at time t0 with the read operation RD1. RD1 occurs during clock cycle 60. A no operation (NOP) is performed during the next clock cycle, cycle 61, and the array write WR1 occurs during the next two clock cycles, cycles 62 and 63. Note that during clock cycle 60 or 61, comparator 20 and inversion determination unit 22 may be generating the corresponding mask. Also, during the NOP, the array may be prepared for the array write. The array write is performed as discussed above using the corresponding mask and write data for the group of NVM cells being written for the first write operation. The second write operation is commenced at time t1 with read operation RD2. RD2 occurs during clock cycle 61 (at the same time as the NOP between RD1 and WR1), a NOP during clock cycle 62, and the write operation WR2 occurs during clock cycles 63 and 64. The third write operation is commenced at time t2 with read operation RD3 occurring during clock cycle 62, a NOP during clock cycle 63, and the write operation WR3 during clock cycles 64 and 65. The fourth write operation is commenced at time t3 with read operation RD4 occurring during clock cycle 63, a NOP during clock cycle 64, and the write operation WR4 during clock cycles 65 and 66. Therefore, note that a write operation is completed at each consecutive clock cycle 63, 64, 65, and 66 such that, once the pipeline is full, a write operation can be completed at each consecutive clock cycle. Processor 12 or memory controller 14 can stagger write operations to different memory partitions of array 18 to ensure that a write operation can be completed per cycle.

Continuing with the example of FIG. 2, the fifth operation is commenced in cycle 64 and is completed in cycle 67. This is possible because partition 30 is available since it has completed its previous write operation in cycle 63. Similarly, the sixth write operation is commenced in cycle 65 and is completed in cycle 68, the seventh write operation is commenced in cycle 66 and is completed in cycle 69, and the eighth write operation is commenced in cycle 67 and is completed in cycle 70. Each write operation to a partition is commenced after the previous write operation to the partition is completed. By staggering write operations to different partitions, a write operation is completed in each of consecutive clock cycles 63-70. Furthermore, since an array write does not generate more than half the maximum peak current, during any given clock cycle, it is possible to have two write arrays occurring simultaneously, along with one read. For example, in cycle 63, array writes WR1 and WR2 are occurring as well as RD4. In this manner, although a write operation may take multiple clock cycles (4, in the example of FIG. 2), they can be completed at one per cycle, which is similar in performance to read operations. Although the array writes require a relatively high current, so long as an array write for each partition overlaps no more than one other array write, the peak current can be maintained at an acceptable level. For the case of the four write operations in FIG. 2, the peak current of all four write operations is no more than the allowed peak current of one array write since only two half current writes occur concurrently. Also, while a single NOP is illustrated as occurring between a read and an array write for a write operation, any number of NOPs (0 or more) may be used to achieve a write operation per cycle. The NOPs can be used to ensure the correct timing for a write operation to a partition to complete before a next write operation to the partition can be commenced.

Therefore, by now it can be understood how improved performance for a write operation in an NVM can be achieved. The use of write data and mask inversion allows for the peak current to be maintained at only half the maximum allowed peak current. The use of partitions and staggering write operations among the partitions allows for the completion of write operations in consecutive clock cycles. The write operations are pipelined among the partitions but the total current generated can be controlled by only allowing two array writes to different partitions to overlap.

The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Each signal described herein may be designed as positive or negative logic, where negative logic can be indicated by a bar over the signal name or an asterix (*) following the name. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Some of the above embodiments, as applicable, may be implemented using a variety of different information processing systems. For example, although FIG. 1 and the discussion thereof describe an exemplary architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Also for example, in one embodiment, the illustrated elements of system 10 are circuitry located on a single integrated circuit or within a same device. Alternatively, system 10 may include any number of separate integrated circuits or separate devices interconnected with each other.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, NVM array 18 can be divided into any number of partitions. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

In one embodiment, a memory device includes a non-volatile memory (NVM) array having a first partition, a second partition, a third partition, and a fourth partition, each having a plurality of NVM groups of NVM cells; and a controller, coupled to the NVM. The controller directs the NVM to perform writing of selected NVM groups from the first, second, third, and fourth partitions during a write operation in which peak current for each partition occurs during an array write portion of the write operation. The controller directs commencement of the write operation with a first NVM group in the first partition in response to a first clock cycle, with a second NVM group in the second partition in response to a second clock cycle, with a third NVM group in the third partition in response to a third clock cycle, and a fourth NVM group in the fourth partition in response to a fourth clock cycle. The controller directs a first array write of the first NVM group to commence at the third clock cycle, continue during the fourth clock cycle, and finish by commencement of a fifth clock cycle; a second array write of the second NVM group to commence at the fourth clock cycle, continue during the fifth clock cycle, and finish by commencement of the sixth clock cycle; a third array write of the third NVM group to commence at the fifth clock cycle, continue during the sixth clock cycle, and finish by commencement of a seventh clock cycle; and a fourth array write of the fourth NVM group to commence at the sixth clock cycle, continue during the seventh clock cycle, and finish by commencement of the eighth clock cycle, whereby writing of the first, second, third, and fourth NVM groups is completed in four consecutive clock cycles. In one aspect, the controller is further characterized as directing a continuing write operation which includes a fifth NVM group from the first partition in response to the fifth clock cycle; and directing a fifth array write of the fifth NVM group to commence at the seventh clock cycle, continue during the eighth clock cycle, and finish by commencement of the ninth clock cycle, whereby writing of the first, second, third, and fourth NVM groups is completed in five consecutive clock cycles. In another aspect, the controller directs the write operation of the first NVM group to use the first clock cycle to perform a read of the first NVM group and the second to prepare for the first array write. In a further aspect, the memory device further includes a content addressable memory (CAM) coupled to the memory controller, wherein the CAM contains data to be written into the NVM groups during writing. In yet a further aspect, the controller is further characterized as comparing the data read from the first NVM group during the first clock cycle to the data to be written into the first NVM group. In yet a further aspect, the controller is further characterized as comparing the data read from the first NVM group to the data to be written is to determine a different portion of the first group that is different from the data to be written and a same portion of the first group that is the same as the data to be written. In yet a further aspect, the controller is further characterized as comparing the data to be written to the data that is read to determine a different portion of the first group is that is different from the data to be written and a same portion of the first group that is the same as the data to be written. In a further aspect, the controller is further characterized by performing the array write of the first group by writing the different portion of the first group that is different from the data to be written if the different portion of the first group is less than half of the first group; and writing the same portion of the first group to a different state if the same portion is less than half of the first group and changing a state of an inverse bit associated with the first group. In a further aspect, the controller is further characterized as performing the array write by writing the same portion of the first group to a different state if the same portion is less than half of the first group and changing a state of an inverse bit associated with the first group. In a further aspect, the NVM cells include magnetic tunnel junctions (MTJs) wherein the controller is further characterized as performing the array write by writing the different portion of the first group that is different from the data to be written if the different portion of the first group is half of the first group and not changing the state of the inverse bit.

In another embodiment, a method of operating a non-volatile memory (NVM) having a plurality of partitions, wherein each partition has a plurality of groups of NVM cells, writing includes a clock cycle to read the group of NVM cells being written, a clock cycle for a no op, and two clock cycles to write the group of NVM cells being written, the method includes writing a first group of NVM cells in a first partition of the plurality of partitions by reading the first group during a first clock cycle, preparing the data to be written during a second clock cycle, and performing an array write of the first group of NVM cells during a third clock cycle and a fourth clock cycle. The method includes writing a second group of NVM cells in a second partition of the plurality of partitions by reading the second group during the second clock cycle, preparing the data to be written during the third clock cycle, and performing an array write during the fourth clock cycle and a fifth clock cycle; writing a third group of NVM cells in a third partition of the plurality of partitions by reading the third group during the third clock cycle, preparing the data to be written during the fourth clock cycle, and performing an array write of the third group during the fifth clock cycle and a sixth clock cycle; and writing a fourth group of NVM cells in a fourth partition of the plurality of partitions by reading the fourth group during the fourth clock cycle, preparing the data to be written during the fifth clock cycle, and performing an array write of the third group during the sixth clock cycle and a seventh clock cycle. In one aspect, the preparing the data to be written during the second clock cycle includes comparing the data to be written to the data that is read to determine a different portion of the first group that is different from the data to be written and a same portion of the first group that is the same as the data to be written. In a further aspect, the performing the array write of the first group includes writing the different portion of the first group that is different from the data to be written if the different portion of the first group is less than half of the first group; writing the same portion of the first group to a different state if the same portion is less than half of the first group and changing a state of an inverse bit associated with the first group. In a further aspect, the performing the array write includes writing the same portion of the first group to a different state if the same portion is less than half of the first group and changing a state of an inverse bit associated with the first group. In a further aspect, the performing the array write further includes writing the different portion of the first group that is different from the data to be written if the different portion of the first group is half of the first group and not changing the state of the inverse bit. In another aspect, the first, second, third, fourth, fifth, sixth, and seventh clock cycles are consecutive. In another aspect, the NVM cells include magnetic tunnel junctions (MTJs).

In yet another embodiment, a memory device includes a non-volatile memory (NVM) array comprising four partitions in which each partition has as plurality of groups of NVM cells; and a memory controller that performs a written operation on each of the four partitions in four cycles per group of NVM cells beginning a clock cycle apart in which two of the four clock cycles for the write operation are for an array write that requires a relatively high current and that the array write for each partition overlaps no more than one other array write so that a peak current of all four write operations is no more than twice the peak current of one group. In one aspect, peak current occurs when an array write is for changing a logic state of half of the group. In another aspect, the NVM cells include magnetic tunnel junctions (MTJs) in which a time to written is less than ten times more than a time to read.

What is claimed is:

1. A memory device, comprising:
   a non-volatile memory (NVM) array having a first partition, a second partition, a third partition, and a fourth partition, each having a plurality of NVM groups of NVM cells; and
   a controller, coupled to the NVM, that:
      directs the NVM to perform writing of selected NVM groups from the first, second, third, and fourth partitions during a write operation in which peak current for each partition occurs during an array write portion of the write operation;
      directs commencement of the write operation with a first NVM group in the first partition in response to a first clock cycle, with a second NVM group in the second partition in response to a second clock cycle, with a third NVM group in the third partition in response to a third clock cycle, and a fourth NVM group in the fourth partition in response to a fourth clock cycle; and
   directs:
      a first array write of the first NVM group to commence at the third clock cycle, continue during the fourth clock cycle, and finish by commencement of a fifth clock cycle;
      a second array write of the second NVM group to commence at the fourth clock cycle, continue during the fifth clock cycle, and finish by commencement of the sixth clock cycle;
      a third array write of the third NVM group to commence at the fifth clock cycle, continue during the sixth clock cycle, and finish by commencement of a seventh clock cycle; and
      a fourth array write of the fourth NVM group to commence at the sixth clock cycle, continue during the seventh clock cycle, and finish by commencement of the eighth clock cycle, whereby writing of the first, second, third, and fourth NVM groups is completed in four immediately consecutive clock cycles,
   wherein the first, second, third, fourth, fifth, sixth, seventh, and eighth clock cycle are consecutive, and each of the first, second, third, and fourth array writes is performed as a read-modify-write, and
   wherein the second clock cycle is immediately consecutive to the first clock cycle, the third clock cycle is immediately consecutive to the second clock cycle, the fourth clock cycle is immediately consecutive to the third clock cycle, the fifth clock cycle is immediately consecutive to the fourth clock cycle, the sixth clock cycle is immediately consecutive to the fifth clock cycle, the seventh clock cycle is immediately consecutive to the sixth clock cycle, and the eighth clock cycle is immediately consecutive to the seventh clock cycle.

2. The memory device of claim 1, wherein the controller is further characterized as:
   directing a continuing write operation which includes a fifth NVM group from the first partition in response to the fifth clock cycle; and
   directing a fifth array write of the fifth NVM group to commence at the seventh clock cycle, continue during the eighth clock cycle, and finish by commencement of the ninth clock cycle, whereby writing of the first, second, third, and fourth NVM groups is completed in five consecutive clock cycles.

3. The memory device of claim 1, wherein the controller directs the write operation of the first NVM group to use the first clock cycle to perform a read of the first NVM group and the second to prepare for the first array write.

4. The memory device of claim 3, further comprising a content addressable memory (CAM) coupled to the memory controller, wherein the CAM contains data to be written into the NVM groups during writing.

5. The memory device of claim 4, wherein the controller is further characterized as comparing the data read from the first NVM group during the first clock cycle to the data to be written into the first NVM group.

6. The memory device of claim 5, wherein the controller is further characterized as:
   comparing the data read from the first NVM group to the data to be written is to determine a different portion of the first group that is different from the data to be written and a same portion of the first group that is the same as the data to be written.

7. The memory device of claim 6, wherein the controller is further characterized by performing the array write of the first group by:
   writing the different portion of the first group that is different from the data to be written if the different portion of the first group is less than half of the first group; and
   writing the same portion of the first group to a different state if the same portion is less than half of the first group and changing a state of an inversion bit associated with the first group.

8. The memory device of claim 7, wherein the controller is further characterized as performing the array write by:
   writing the same portion of the first group to a different state if the same portion is less than half of the first group and changing a state of an inversion bit associated with the first group.

9. The memory device of claim 8, wherein the NVM cells comprise magnetic tunnel junctions (MTJs) wherein the controller is further characterized as performing the array write by:
   writing the different portion of the first group that is different from the data to be written if the different portion of the first group is half of the first group and not changing the state of the inversion bit.

10. A method of operating a non-volatile memory (NVM) having a plurality of partitions, wherein:
  each partition has a plurality of groups of NVM cells;
  writing comprises a clock cycle to read the group of NVM cells being written, a clock cycle for a no op, and two clock cycles to write the group of NVM cells being written, the method comprising:
    writing a first group of NVM cells in a first partition of the plurality of partitions by reading the first group during a first clock cycle, preparing the data to be written during a second clock cycle, and performing an array write of the first group of NVM cells during a third clock cycle and a fourth clock cycle;
    writing a second group of NVM cells in a second partition of the plurality of partitions by reading the second group during the second clock cycle, preparing the data to be written during the third clock cycle, and performing an array write during the fourth clock cycle and a fifth clock cycle;
    writing a third group of NVM cells in a third partition of the plurality of partitions by reading the third group during the third clock cycle, preparing the data to be written during the fourth clock cycle, and performing an array write of the third group during the fifth clock cycle and a sixth clock cycle; and
    writing a fourth group of NVM cells in a fourth partition of the plurality of partitions by reading the fourth group during the fourth clock cycle, preparing the data to be written during the fifth clock cycle, and performing an array write of the third group during the sixth clock cycle and a seventh clock cycle, wherein the first, second, third, fourth, fifth, sixth, and seventh clock cycle are consecutive,
    wherein the second clock cycle is immediately consecutive to the first clock cycle, the third clock cycle is immediately consecutive to the second clock cycle, the fourth clock cycle is immediately consecutive to the third clock cycle, the fifth clock cycle is immediately consecutive to the fourth clock cycle, the sixth clock cycle is immediately consecutive to the fifth clock cycle, the seventh clock cycle is immediately consecutive to the sixth clock cycle, and the eighth clock cycle is immediately consecutive to the seventh clock cycle.

11. The method of claim 10, wherein the preparing the data to be written during the second clock cycle comprises:
  comparing the data to be written to the data that is read to determine a different portion of the first group that is different from the data to be written and a same portion of the first group that is the same as the data to be written.

12. The method of claim 11, wherein the performing the array write of the first group comprises:
  writing the different portion of the first group that is different from the data to be written if the different portion of the first group is less than half of the first group.

13. The method of claim 12, wherein the performing the array write comprises:
  writing the same portion of the first group to a different state if the same portion is less than half of the first group and changing a state of an inversion bit associated with the first group.

14. The method of claim 13, wherein the performing the array write further comprises:
  writing the different portion of the first group that is different from the data to be written if the different portion of the first group is half of the first group and not changing the state of the inversion bit.

15. The method of claim 10, wherein the first, second, third, fourth, fifth, sixth, and seventh clock cycles are consecutive.

16. The method of claim 10, wherein the NVM cells comprise magnetic tunnel junctions (MTJs).

17. A memory device, comprising:
  a non-volatile memory (NVM) array comprising four partitions in which each partition has as plurality of groups of NVM cells; and
  a memory controller that performs a written operation on each of the four partitions in four cycles per group of NVM cells beginning a clock cycle apart in which two of the four clock cycles for the write operation are for an array write that requires a relatively high current and that the array write for each partition overlaps no more than one other array write so that a peak current of all four write operations is no more than twice the peak current of one group.

18. The memory device of claim 17, wherein peak current occurs when an array write is for changing a logic state of half of the group.

19. The memory device of claim 17, the NVM cells comprise magnetic tunnel junctions (MTJs) in which a time to written is less than ten times more than a time to read.

* * * * *